United States Patent [19]
Venant

[11] Patent Number: 6,137,692
[45] Date of Patent: Oct. 24, 2000

[54] ELECTROMAGNETIC SHIELDING SCREEN AND CIRCUIT SUPPORT HAVING SUCH A SCREEN

[75] Inventor: Sylvain Venant, Le Mans, France

[73] Assignee: U.S. Philips Corporation, New York, N.Y.

[21] Appl. No.: 09/082,447

[22] Filed: May 20, 1998

[30] Foreign Application Priority Data

May 29, 1997 [FR] France ................................... 97 06581

[51] Int. Cl.[7] ...................................................... H05K 9/00
[52] U.S. Cl. ............................ 361/800; 361/816; 361/818
[58] Field of Search .................................... 361/800, 816, 361/818

[56] References Cited

U.S. PATENT DOCUMENTS 4,658,334  4/1987  McSparran et al. .................... 361/415
5,550,713  8/1996  Pressler et al. .......................... 361/818
5,917,708  6/1999  Moran et al. ............................ 361/800

FOREIGN PATENT DOCUMENTS

0265285A2  4/1988  European Pat. Off. ......... H05K 9/00
0594041A1  4/1994  European Pat. Off. .
06252282   9/1994  Japan ............................. H01L 23/06

*Primary Examiner*—Leo P. Picard
*Assistant Examiner*—Hung Van Duong
*Attorney, Agent, or Firm*—Dicran Halajian

[57] ABSTRACT

The invention discloses an electromagnetic shielding screen for a printed circuit board or any other similar support of an electronic circuit. This shielding includes a band and one or various separate compartments, each having a cover whose form corresponds to that of the associated compartment, and the outside dimensions of each cover correspond at least to the inside dimensions of the associated compartment for forcibly fastening each cover in its associated compartment.

5 Claims, 2 Drawing Sheets

ELECTROMAGNETIC SHIELDING SCREEN AND CIRCUIT SUPPORT HAVING SUCH A SCREEN

FIELD OF THE INVENTION

The present invention relates to an electromagnetic shielding screen comprising a band and at least a cover provided for covering the band, the band and the cover being made at least partly of an electrically conductive material and forming a sub-assembly provided for being applied to the support of the circuit to be shielded. Such a shielding screen is provided to be placed against a printed circuit board or against any other similar electronic circuit support, for example, in a portable telephony device.

BACKGROUND OF THE INVENTION

An example of an association of a printed circuit board and an electromagnetic shielding screen is described in European patent application EP-A-0 594 041. According to the structure indicated in this document and illustrated in FIG. 1, the shielding screen is formed by a band 11 and a cover covering this band, which together form a sub-assembly provided for being applied to the printed circuit board 12 (or other support of the circuit to be shielded). This sub-assembly is made at least partly of an electrically conductive material so as to provide a kind of Faraday cage for the protection of the circuit. The making of the shielding in two separate parts permits of gaining access as required to the protected circuits by opening the cover.

The connection modes habitually found for fixing the cover to the band are soldering, in which case the connection is irreversible or at least implies sufficiently heavy hardware manipulations (unsoldering/resoldering of a cover), or also the use of solutions by way of plates or bands forming a spring and clipping onto the band. This type of connection represented for example in FIG. 2 may easily be disassembled this time, but the attempts made show that shaking or shocks with structures made in this manner often lead to the unwanted opening of the cover.

SUMMARY OF THE INVENTION

It is thus an object of the invention to propose a shielding screen which can be dismounted, whose behavior with respect to shaking or shocks is much better than that obtained with the previous constructions.

For this purpose, the invention relates to an electromagnetic shielding screen as defined in the opening paragraph of the description and which is furthermore characterized in that the fastening of the cover to the band is ensured by the fact that the form of the cover corresponds to that of the band and that the outside dimensions of the cover correspond at least to the inside dimensions of the band for being fastened to each other by force. The attempts made with this type of structure confirm the mechanical reliability of the proposed solution.

The solution remains applicable even when the band of the shielding screen marks off the boundary of various separate compartments. In that case, the form of the cover corresponds to that of the associated compartment for each of the compartments for which it is desirable to have access to the circuit protected by the shielding screen, and the outside dimensions of the cover correspond at least to the inside dimensions of said associated compartment, so that each cover is forcibly fastened to its associated compartment. Obviously, the invention relates to either of these shielding screen structures, but also to any printed circuit board or any other similar electronic circuit support which is equipped with such a structure for the protection of this circuit.

These and other aspects of the invention will be apparent from and elucidated with reference to the embodiments described hereinafter.

DETAILED DESCRIPTION OF THE INVENTION

Figure 1:
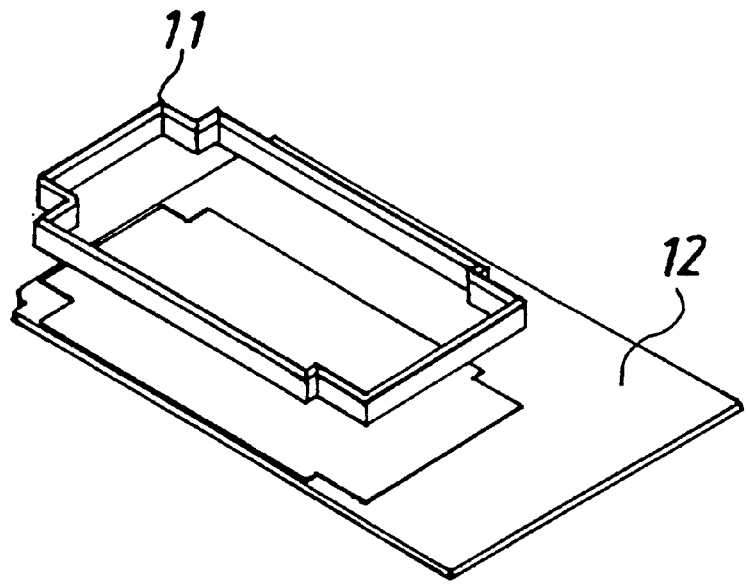
FIG. 1 shows an example of a shielding screen band according to the state of the art placed against the board or the support of the circuit to be protected.
Figure 2:
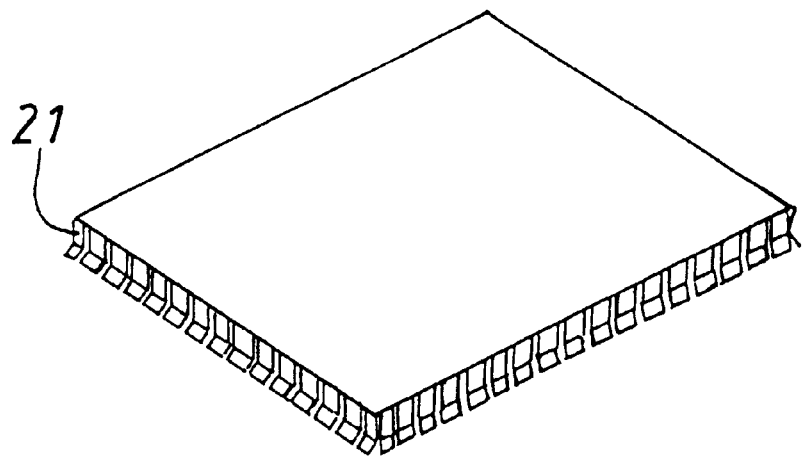
FIG. 2 illustrates an example of a shielding screen cover according to the state of the art in which pins permit of the fixation of the cover against corresponding edges of the band or of compartments thereof.
Figure 3:
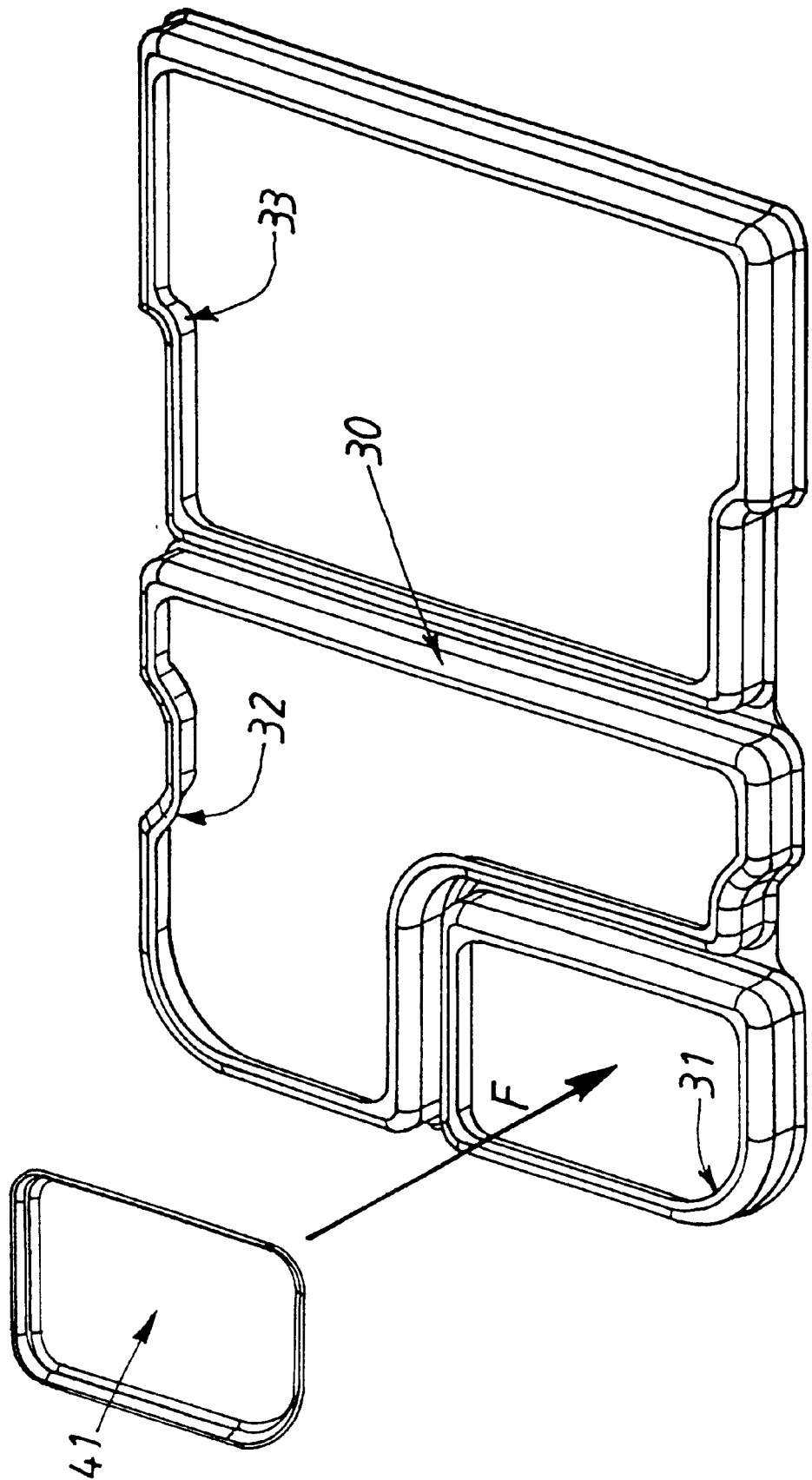
FIG. 3 shows the structure and the connecting mode which make it possible to obtain a better behavior between the band and its cover(s) according to the invention in the case of shaking or shocks.

According to the invention, the structure now proposed comprises, as indicated in FIG. 3, a shielding band 30 open at its upper end and comprising three compartments 31, 32, 33 in the example shown. This band 30 is at least partly made of a cast conductive material (magnesium or aluminum, folded or deep-drawn steel, Zamak alloy, . . . ). To the compartments of the band 30 are associated with covers having a corresponding form, of which a sole one, the cover 41 for the compartment 31, is represented. These covers which may be removed to permit access to the marked-off area inside the band 30 are also made at least partly of a conductive material (folded or deep-drawn steel, conductive or metal-plated plastic material, carton formed or folded and covered by a metallic layer . . . ).

The association of the band and the covers (of the cover when the band marks off only a single and unique compartment) forms, as observed previously for the printed circuit board or the circuit support, a Faraday cage, but the opening of the or of one of the covers thereof is now made without jeopardizing the mechanical behavior of the band/cover(s) assembly. Indeed, each cover is marked off by a contour whose form corresponds to that of the contour of the band and whose outside dimensions are determined correctly relative to the inside dimensions of this contour that corresponds to the band, so that the cover forcibly enters its inside and is rigidly immobilized there whatever the shaking or shocks which the band/cover(s)/circuit support could thereafter be subjected to.

What is claimed is:

1. An electromagnetic shielding screen for a printed circuit board or a support of an electronic circuit, comprising a band and a cover for covering the band, the band and the cover being made at least partly of an electrically conductive material and forming a sub-assembly provided for being applied to the support of the electronic circuit to be shielded, wherein fastening of the cover to the band is ensured by a form of the cover corresponding to a shape of the band, and wherein a cover contour of said cover has outside dimensions that correspond at inside dimensions of a band contour of the band for being fastened to each other by force, said cover contour being configured for forcible insertion into said band contour.

2. The electromagnetic shielding screen as claimed in claims 1, wherein the band marks off boundaries of separate compartments, and wherein each of said compartments is covered by a corresponding cover having outside dimensions that correspond to inside dimensions of said associated compartment for forcibly fastening each said corresponding cover in its associated compartment.

3. The electromagnetic shielding screen as claimed in claim 1, wherein the band is made of a material chosen from the following list: battered aluminum or magnesium, folded or deep-drawn steel, Zamak alloy, and wherein said cover is made of a material chosen from the following list: folded or deep-drawn steel, conductive or metal-plated plastic material, formed or folded carton and carton having a metal coating.

4. An electromagnetic shield comprising:

a band for containing an electronic circuit, said band having a band contour; and a cover for covering said band, said cover having a cover contour, wherein an inner dimension of said band contour corresponds to an outer dimension of said cover contour so that said cover contour is forcible insertable into said band contour.

5. An electronic circuit having an electromagnetic shield, said electromagnetic shield comprising:

a band for containing said electronic circuit, said band having a band contour; and a cover for covering said band, said cover having a cover contour, wherein an inner dimension of said band contour corresponds to an outer dimension of said cover contour so that said cover contour is forcible insertable into said band contour.

* * * * *